United States Patent [19]

Lockwood et al.

[11] Patent Number: 4,597,054
[45] Date of Patent: Jun. 24, 1986

[54] ARBITER CIRCUIT AND METHOD

[75] Inventors: James M. Lockwood, West Columbia; Arthur F. Cochcroft, Jr., Lexington, both of S.C.

[73] Assignee: NCR Corporation, Dayton, Ohio

[21] Appl. No.: 446,117

[22] Filed: Dec. 2, 1982

[51] Int. Cl.[4] .............................................. G06F 13/16
[52] U.S. Cl. ...................................................... 364/900
[58] Field of Search ................................ 364/200, 900

[56] References Cited

U.S. PATENT DOCUMENTS

| | | | |
|---|---|---|---|
| 3,638,198 | 2/1972 | Balogh, Jr. | 364/200 |
| 4,096,572 | 6/1978 | Namimoto | 364/200 |
| 4,334,288 | 6/1982 | Bootter | 364/900 |
| 4,339,808 | 7/1982 | North | 364/900 |
| 4,374,413 | 2/1983 | Comfort et al. | 364/200 |
| 4,418,385 | 11/1983 | Bourrez | 364/200 |

Primary Examiner—Gareth D. Shaw
Assistant Examiner—Daniel K. Dorsey
Attorney, Agent, or Firm—J. T. Cavender; Edward Dugas; Donald P. Gillette

[57] ABSTRACT

Arbitration as provided in two separate levels, first between two signals that may contend for access to a system resource, such as a memory, and second between the winner of the first arbitration and another source, such as a refresh signal timer, that must have access to the system resource periodically and independently of requests for access from the other signals. The winning signal of the first arbitration is not continuous but is divided into intervals, and the refresh timer gains control of the second arbitration at the end of each interval of control by the winning signal from the first arbitration.

12 Claims, 10 Drawing Figures

ARBITER CIRCUIT AND METHOD

BACKGROUND OF THE INVENTION

This invention relates to an arbiter circuit and an associated method for determining access to a system resource in a system that has at least three signals seeking access to the resource, a first one of which must have access at predetermined periodic intervals to the exclusion of any of the other signals, and at least two other of the signals being capable of maintaining access on a mutually exclusive basis for an indefinite period of time that may be longer than one of the predetermined periodic intervals.

The concept of applying three or more signals to separate input terminals of a single arbiter that can determine which of the three signals, if they are all submitted simultaneously so as to interfere with each other, can pass through the arbiter circuit and obtain access to a common part of a following circuit, such as the memory in a computer, is well known. One way of arbitrating contention among three such signals is simply to enable each input circuit in turn. One difficulty of such a procedure is that, if no signal is being applied at a given time to one of the input terminals, as will frequently be the case, any time lost in enabling that input terminal will unnecessarily slow down the operation of the overall system.

Another, and potentially more significant problem arises from the fact that the nature of signals applied to the system resource, and especially to a memory frequently have three subintervals, or cycles. One is a cycle in which information at a given memory location is read. A second is a cycle in which either that information or a flag bit that determines access to the memory is modified. The third is a writing cycle, in which new information is written into a given memory location. Such read-modify-write (RMW) cycles must be carried out in unitary fashion so that the system resource must be interactively latched to a given input terminal from the beginning of the read cycle to the end of the write cycle. Frequently the operation is such that the input circuit ceases to control access to the memory during the modify portion of the RMW cycle, and it is then possible for another signal, applied by way of another input circuit, to latch onto access to the memory. If that happens, the information received through the second input terminal can be applied as a signal to be written into the first address, which would be completely incorrect.

Another problem is that any one of the signals can have a duration that will lock out the other signals for a very long period of time. This can be especially troublesome if the common circuit element to which access is sought is a dynamic random access memory (DRAM) that operates on the basis of storage of an electric charge that can leak off after a certain interval of time and must be refreshed within that interval in order for the system to operate properly. It is unacceptable for another signal that does not have the effect of refreshing the memory, except for that part of the memory that may be used by such other signal, to latch onto control of the access to the DRAM for a period of time longer than the refresh interval.

It is one of the objects of the present invention to provide a high-speed system and a method for separating arbitration among different signals so that arbitration between two or more of the signals that, as between themselves, can maintain control of access to a system resource for an indeterminately long period of time, can be determined in a first arbiter, with the successful signal then contending in a second arbiter with a signal that must have access to the system resource at some time within each periodic interval.

Another object of the invention, in which the winning signal of the first arbitration is divided into two or more active intervals separated by one or more inactive intervals, is to arrange for the second arbitration to allow the signal that must have periodic access to have such access at the end of each active interval, or transaction, of the successful signal.

A further object of the invention is to interrupt the operation of the first arbiter after the lapse of a certain length of time if the signal that has obtained control of the first arbiter and is therefore the winning signal for submission to the second arbiter, appears not to be operating correctly, as, for example, would be true if the controlling signal were not broken up into short transactions.

Further objects will become apparent from the teachings of the following specification, taken together with the drawings.

SUMMARY OF THE INVENTION

In accordance with the present invention, arbitration takes place among at least first, second and third signals in two separate arbiters. The nature of the signals is such that one of them must have access to a system resource within each periodic interval of time, the period being determined by the nature of the system resource. The other signals seeking access to the system resource are of a nature such that each of them is likely to require access to the system resource for only a short interval of time after obtaining access, although it is possible that each of the latter signals may maintain control of access to the system resource for an indeterminately long period of time. The arbiter in which the arbitration between the latter signals takes place may include a latch circuit of the type described and claimed in U.S. Pat. No. 4,093,878. The circuit described therein provides a clear determination as to which of two substantially contemporaneous signals applied to its input terminals will control the output thereof. The first arbiter further includes a flip-flop circuit controlled by an output signal from the latch circuit and by one of the contending signals.

The output of the latch circuit also controls a gate to allow an input signal to pass through it, and in a similar manner, the flip-flop has an output circuit that controls another gate which, in turn, controls the passage therethrough of still another input signal. The other connections between the latch and the flip-flop circuit in the first arbiter result in only one of the two gate circuits being open at a time to allow the passage of only one input signal therethrough.

A combining circuit, for example an OR circuit, capable of responding to output signals from either of the gate circuits transmits the winning signal of the first arbitration to one of the input terminals of a latch circuit in a second arbiter. The second arbiter has a second input terminal connected to receive signals from a third source, such as a refresh timer, and the second arbiter has interconnections between the latch circuit and a flip-flop circuit in the second arbiter such that only the latch circuit or the latter flip-flop circuit will produce an output signal at any given time. Signals from the latter latch and flip-flop circuit are both applied (but in alternate intervals of time, since they cannot overlap) to separate gates that control access to the system resource that is to be controlled. If the third source provides signals which are in the nature of refresh signals that must be applied during each periodic interval, the refresh operation will take place at the end of a predetermined interval from the last such refresh as determined by an output signal from the second arbiter output circuit through which the refresh signals pass.

In addition, an output signal from the terminal at the output of the second arbiter that passes winning signals from the first arbiter may be used to control a safety timer so that if there are no individual transactions in the winning signal within a predetermined length of time, the safety timer will be actuated to interrupt operation of the first arbiter. More specifically, this invention is useful in a system comprising a system resource to which a first signal must be applied within an interval of time of predetermined length and to which at least second and third intermittent signals, which may be in contention with each other and with the first signal for access to the resource, may be applied.

The invention incorporates a first arbiter means comprised of at least a first and a second input means for receiving said second and said third intermittent signals, respectively, and at least first and second output means, for delivering an enabling signal to either said first or said second output means, according to which of the intermittent signals establishes control of said first arbiter means during a substantially contemporaneous occurrence of the intermittent signals. The invention further incorporates first and second input terminal means for receiving fourth and fifth control signals, respectively. Also incorporated in the invention is a first control means connected to the first output means of the first arbiter means to be controlled by enabling signals from the first output means, the first control means being connected to the first input terminal means for receiving the fourth control signal, for outputting the fourth control signal when the first control means is enabled. A second control means is connected to the second output means of the first arbiter means to be controlled by enabling signals from the second output means, such second control means also being connected to the second input terminal means for receiving the fifth control signal, for outputting the fifth control signal when the second control means is enabled. A second arbiter means is incorporated in the invention comprising first input means connected to the first and the second control means to receive the signals outputted therefrom, and further comprising second input means, connected to receive the first signal, and having first and second output means for arbitrating in favor of said first signal when contention occurs between said first signal and the signal provided either by said first or said second control means. Also included is a resource access control means connected to the first and the second output means of the second arbiter means to be controlled selectively by output signals therefrom.

The invention also includes a method to be used with a system having a system resource that can be controlled by only one signal at a time, out of a plurality of at least three signals applied substantially simultaneously to control the system resource, at least one of the second and third of such signals being capable of controlling the system resource indefinitely to the exclusion of the first signal, the system having a mandatory requirement that the first signal have control of the system resource at predetermined periodic intervals to the exclusion of any of the other signals, the method comprises the steps of; arbitrating between the second and the third signals to determine, as between them, the successful one to enable passage of a signal related to the successful one; presenting the enabled signal for such arbitration as a series of transactions with interruption times between each of the transactions and its successor transaction; and arbitrating between the presented signal and the first signal to determine, as between them at the end of each of the transactions, the controlling signal to control the signal resource.

BRIEF DESCRIPTION OF THE DRAWINGS

FIGS. 1A and 1B are to be placed side-by-side with FIG. 1A on the left and FIG. 1B on the right.

DETAILED DESCRIPTION OF THE INVENTION

Figure 1A:
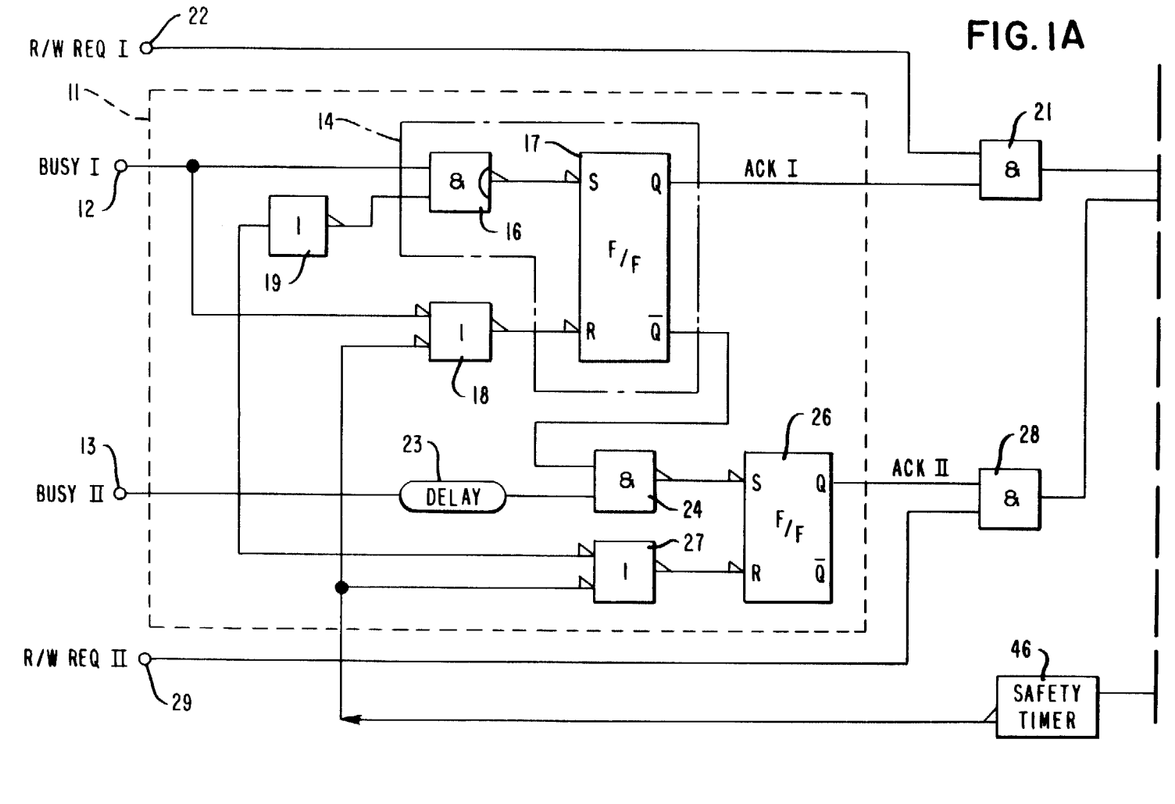
FIGS. 1A and 1B comprise a logic block diagram of a preferred embodiment of the invention.
Figure 1B:
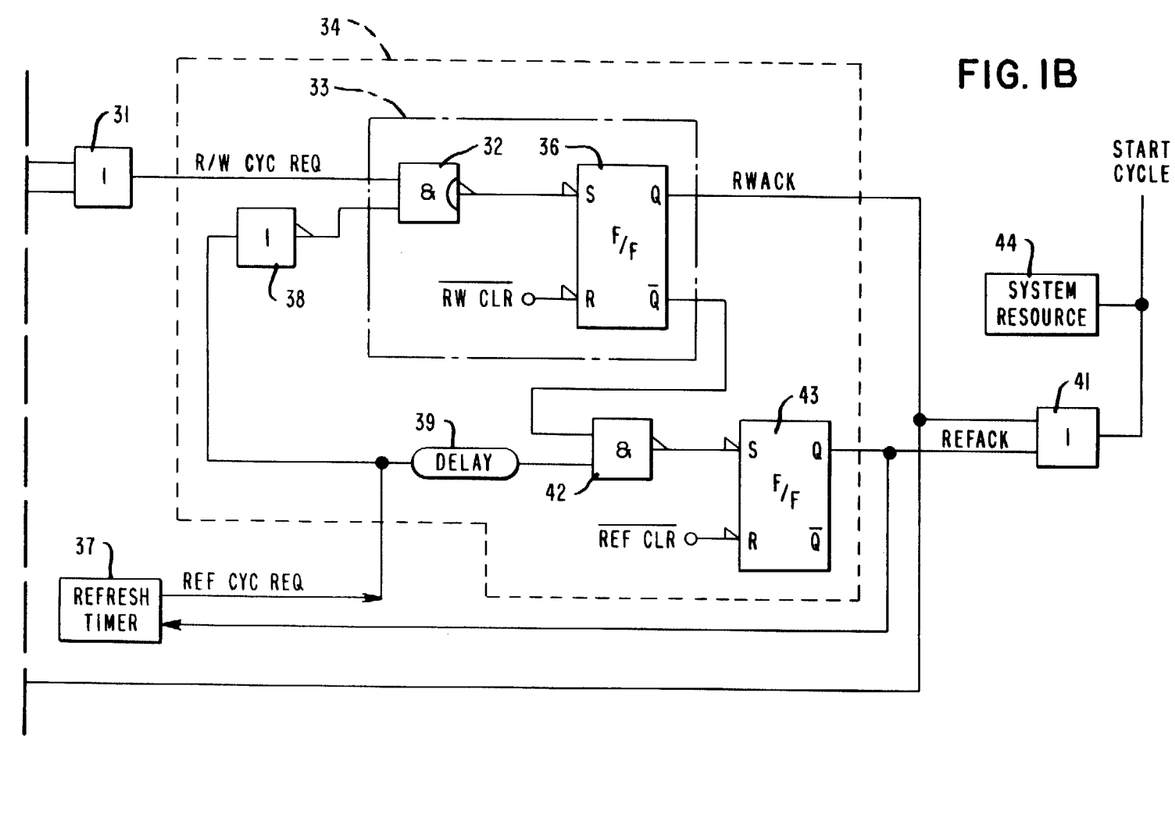

The arbitration system illustrated in FIGS. 1A and 1B includes a first arbiter 11 having two input terminals 12 and 13 to which potentially competing signals may be applied. The competition between the signals is due to the fact that they may be applied to the terminals 12 and 13 simultaneously, or substantially so. For convenience, and to be consistent with the fact that the circuit can be used with a variety of different types of signals, the signal applied to the terminal 12 is indicated as BUSY I, and that applied to the terminal 13 is identified as BUSY II. The BUSY I signal is connected through the terminal 12 directly to one of the input circuits of a latch circuit 14, such as that described in U.S. Pat. No. 4,093,878. This input circuit is one of the input circuits to an open-collector NAND gate 16, the output circuit of which is connected to the setting terminal of a flip-flop circuit 17. The input terminal 12 is also connected to one of the input circuits of an OR gate 18, the output circuit of which is connected to the reset terminal of the flip-flop 17. The nature of the signals in this part of the overall circuit is such that the signals at the terminal 12 are low-active, and the output signals of the OR gate are also low-active and are connected to a reset terminal that responds to low signals. The other input terminal 13 is connected through an inverter 19 to the other input circuit of the NAND gate 16 of the latch circuit 14.

The Q output terminal of the flip-flop 17 of the latch 14 is connected to one of the input circuits of an AND gate 21 that has another input circuit connected to receive signals applied to an input terminal 22. The latter signals are designated as read-write request I (R/W REQ I) signals, which are related to the BUSY I signals in the sense that, in normal operation, both the BUSY I signal and the R/W REQ I signal must be present at the same time to propagate a controlling signal farther along the system, and thus these signals mutually enable each other in the AND gate 21 to obtain an output signal from the AND gate only when both of these input signals are present.

The input terminal 13 that receives the BUSY II signal is also connected to a delay element 23 that delays the BUSY II signal by an interval of time, such as about 50 ns., sufficient to be certain that the latch 14 has settled into a fixed condition in the event that both the BUSY I and the BUSY II signals are applied simultaneously or nearly so. The output of the delay element 23 and the Q/ output signal of the flip-flop 17 in the latch 14 are connected to input terminals of a NAND gate 24, the output terminal of which is connected to the setting terminal of a flip-flop circuit 26. The input terminal 13 is also connected to one of the input circuits of another OR gate 27, the output circuit of which is connected to the resetting terminal of the flip-flop 26. Like the OR gate 18, the OR gate 27 is of the type that has low active input circuits and a low active output circuit, and the resetting terminal of the flip-flop 26 is actuated by a low signal.

The Q output terminal of the flip-flop 26 is connected to one of the input circuits of an AND gate 28 that has another input circuit connected to an input terminal 29 through which another read-write request signal (R/W REQ II) is received. Propagation of a signal through the AND gate 28 requires that the BUSY II signal and the R/W REQ II signal both be present at the same time.

The output terminals of the AND gates 21 and 28 are connected to input terminals of another OR gate 31. Since a typical purpose of the output signal of the OR gate 31 is to request a read-write cycle of operation of a computer system, the signal at that point is identified as R/W CYC REQ and is applied to one input circuit of an open-collector NAND gate 32 of a latch circuit 33 in a second arbiter 34. The latch circuit 33 is identical with the latch circuit 14, and in addition to the open-collector NAND gate 32, it comprises a flip-flop circuit 36.

The second signal to be applied to the second arbiter 34 is, in this embodiment, the output signal of a refresh timer 37. This signal is applied through an inverter 38 to a second input circuit of the open collector NAND gate 32 and to a delay element 39 to delay the signal by, for example, 50 ns.

The flip-flop 36 has a Q output terminal connected to an OR gate 41 and a Q/ terminal connected to one of the input circuits of a NAND gate 42. The NAND gate has another input circuit connected to the delay element 39 to receive delayed signals therefrom. The output terminal of the NAND gate 42 is connected to the setting terminal of a flip-flop circuit 43, and a clearing signal at the end of the refresh interval, and thus identified as REF CLR/, is connected to the resetting terminal of the flip-flop 43. A signal to clear the flip-flop 36 after completion of a read-write cycle is identified as R/W CLR/ applied to the resetting terminal of the flip-flop 36. The Q output terminal of the flip-flop 43 is connected to another input circuit of the OR gate 41, the output circuit of which is connected, to a system resource 44 that is to be controlled by whichever signal gains control of the second arbiter 34 at any given time. A dynamic random access memory in a computer is a typical system resource 44. It is to be understood that there will be occasions when no signal is being applied to either input terminal of either arbiter 11 or 34. The Q output terminal of the flip-flop 36 is also connected to a safety timer circuit 46 that has an output terminal connected to one input terminal of each of the OR gates 18 and 27.

The operation of the circuit in FIGS. 1A and 1B is such that an R/W CYC REQ signal will be produced at the output of the OR gate 31 if the R/W REQ I signal and the BUSY I signal are supplied simultaneously to the input terminals 22 and 12 and no signals are applied to the terminals 13 and 29. In a corresponding manner, an output signal R/W CYC REQ will be produced at the output terminal of the OR gate 31 if a BUSY II signal is applied to the input terminal 13 simultaneously with an R/W REQ II signal to terminal 29 and no signals are applied to the terminals 12 and 22.

The arbitration operation comes into effect if BUSY I and BUSY II signals are applied substantially contemporaneously to the input terminals 12 and 13. The nature of the latch 14 is such that, if the BUSY I signal obtains preference, an output signal based on the BUSY I will be produced at the Q terminal of the flip-flop 17 and applied to enable the AND gate 21 to transmit the R/W REQ I signal therethrough. At the same time, the Q/ output signal of the flip-flop 17 goes low and disables the NAND gate 24, preventing the delayed BUSY II signal from passing through that NAND gate to the setting terminal of the flip-flop 26.

On the other hand, if the BUSY II signal applied to the input terminal 13 obtains preference, it will disable the NAND gate 16 by driving the output of the inverter 19 low. Just to be sure that the latch 14 has had time to respond to a BUSY I signal, if such a signal has just preceded the BUSY II signal, the BUSY II signal is required to pass through the delay element 23 to delay it by approximately 50 ns before being applied to the NAND gate 24. If the latch 14 has not been actuated in response to a BUSY I signal, the Q/ output terminal of the flip-flop 17 will be high, so that a high output signal from the delay line 23 will result in a low signal at the output of the NAND gate 24, and this low signal will be of the proper polarity to actuate the setting of the flip-flop 26.

It will thus be seen that, when the timing of the BUSY I and BUSY II signals is such that the BUSY I signal is prior, the flip-flop 26 will be prevented from receiving a setting signal because the NAND gate 24 will be disabled by the Q/ output signal of the flip-flop 17. Conversely, when the BUSY II signal is prior to the BUSY I signal, the NAND gate 16 will be prevented from operating by virtue of the inverted BUSY II signal supplied through the inverter 19 to the input of the AND gate 16.

When the BUSY II signal applied to the input terminal 13 is successful in obtaining control of the arbiter 11, a high signal is produced at the Q output terminal of the flip-flop 26 and applied to the AND gate 28 to enable it. This allows the R/W REQ II signal applied to the terminal 29 to pass through the AND gate 28 to the OR gate 31 in the same way that the output of the AND gate 21 was able to pass through the OR gate 31. Either signal through the OR gate may be considered an R/W CYC REQ signal and used as one of the input signals to the second arbiter 34.

The operation of the arbiter 34 is similar to that of the arbiter 11, except that its two input signals are the R/W CYC REQ signal and the output signal of the refresh timer 37. The output signal of the arbiter 34 is applied through the OR gate 41 to the system resource 44.

The operation of the system in FIGS. 1A and 1B will be described in more detail with reference to the timing diagrams in FIGS. 7-9. However, before considering the detailed timing diagrams, it will be helpful to refer to FIGS. 2-6, which indicate the basic symbology used in the timing diagrams.

Figure 2:
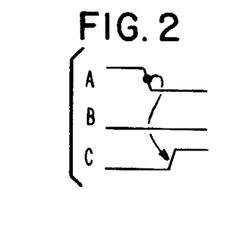
FIGS. 2 through 6 are basic symbology diagrams used in describing the causal relationship between two or three signals.

FIG. 2 illustrates a time relationship between two signals A and C. A third signal B is illustrated but has no effect on the other two during the interval illustrated. Within this interval, the signal A goes from a high level to a low level and therefore has a falling edge. A circuit that would be represented by the relationship in FIG. 2 would be one in which a component having an output signal represented by waveform C was caused to go from its low level to its high level due to the falling edge in waveform A, alone. The directions, or polarities, of the transitions are not important; what is important is that an event represented by the dot on one of the waveforms be on the arrow directed toward the other of the waveforms.

Figure 3:
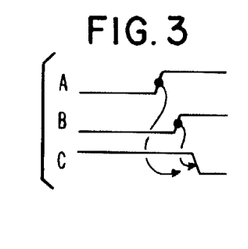

FIG. 3 is symbolic of a condition in which an event (the rising edge) on waveform A, or an event (the rising waveform) on waveform B, or both of these events, can cause the event (falling edge) on waveform C toward which both of the arrows point.

Figure 4:
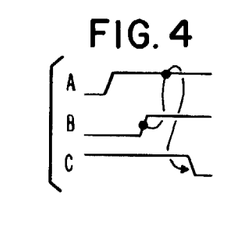

FIG. 4 illustrates a condition in which an event (the rising edge) on waveform B and a condition (the fact that the waveform A is at its high level) must both happen to cause an event (the falling edge) on waveform C to occur.

Figure 5:
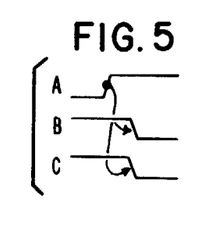

FIG. 5 is symbolic of a condition in which an event (the rising edge) on waveform A causes events (falling edges) on both waveforms B and C.

Figure 6:
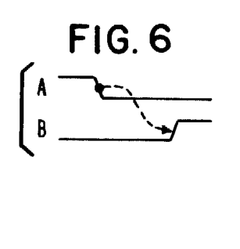

FIG. 6 illustrates a condition in which an event (the rising edge) in waveform B happens because a prior event (the falling edge) in waveform A occurred, but the relationship between the two is not completely described. There may be delays or additional logic dependencies that are not shown.

Figure 7:
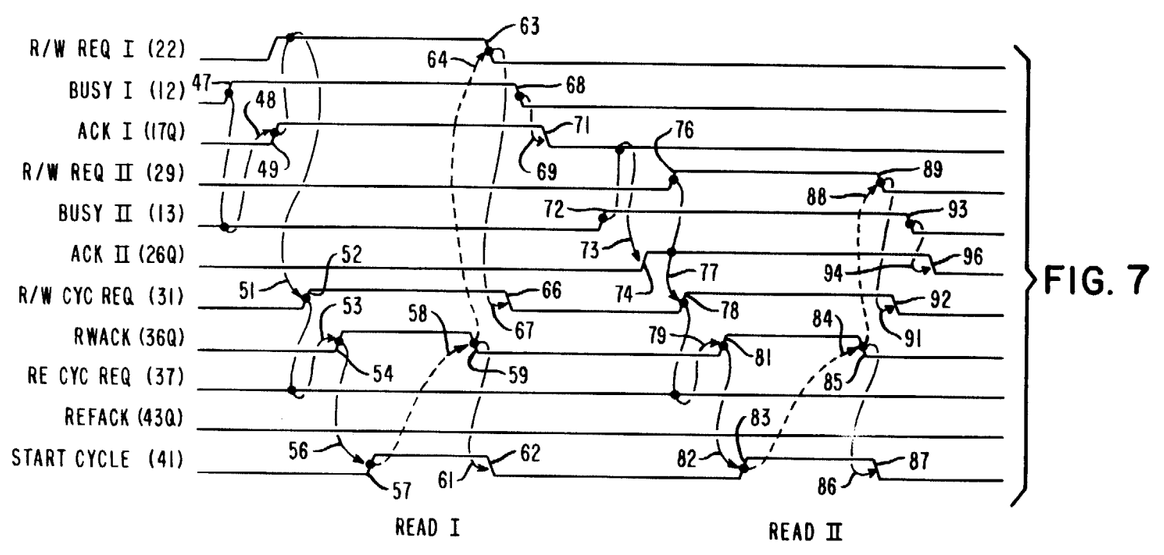
FIG. 7 illustrates signals produced during the operation of the FIGS. 1A and 1B embodiment in a read/write cycle without contention.

With the symbols in FIGS. 2-6 in mind, FIG. 7 will be considered. This figure illustrates signals produced during normal operation of the circuit in FIGS. 1A and 1B in which read/write cycles occur without any contention between the BUSY I and BUSY II signals. The graphs in FIG. 7 are identified by signal designation and the circuit point at which they occur. The first condition to be described with the assistance of FIG. 7 is the occurrence of a BUSY I signal along with an R/W REQ I signal.

In FIG. 7, some event that precedes any of the operations in the circuit in FIGS. 1A and 1B causes the BUSY I signal at the terminal 12 to go from its low value to its high value, thereby producing a rising edge 47. Since the BUSY II signal is assumed to be inactive, the terminal 13 will be at its low level, and these two conditions cause the Q output terminal of the flip-flop 17 to go to its high condition, as indicated by the arrow 48. This is acknowledged by a signal ACK I, which goes from its low condition to its high condition along a rising edge 49.

The R/W REQ I signal applied to the terminal 22 is produced independently of the BUSY I signal but must occur, or be true, during the time that the BUSY I signal is in existence. The existence of the BUSY I signal is proven by the fact that the ACK I signal has gone to its high level, and this, together with the existence of the R/W REQ I signal at its high level, as indicated by an arrow 51, produces a rising edge 52 in the R/W CYC REQ signal at the output of the AND gate 21 and, therefore, at the output of the OR gate 31.

It will be assumed throughout the circumstances described with reference to FIG. 7 that the refresh timer 37 does not request a refresh cycle in contention with the R/W CYC REQ signal. As a result, the latter signal at the output of the refresh timer 37 remains at its low level throughout the period of time represented in FIG. 7 and the output of the inverter 38 remains at its high level during the same time. This condition, together with the rising edge 52 of the R/W CYC REQ signal, produces the necessary input conditions of the the NAND gate 32 to set the flip-flop 36. These conditions are represented by an arrow 53, which points to a rising edge 54 at the Q terminal of the flip-flop 36. Having the Q terminal of the flip-flop 36 in its high condition represents an acknowledgment that the read/write signal can control the system resource 44, as indicated by an arrow 56 leading from the rising edge 54 to a rising edge 57 on a START CYCLE signal, which is representative of the output signal of the OR gate 41. This is the beginning of an inverval identified as the READ I interval in which access to the system resource 44 is controlled.

The duration of the READ I interval is not determined by any of the timing means in the circuit in FIG. 1 but by the signals applied to that circuit. As a result, the indeterminate length of the READ I interval is indicated by a dotted arrow 58. At the end of that indeterminate time, the RWAC signal is caused to return to its low value along a falling edge 59. As a result, and as is indicated by an arrow 61, the output signal of the OR gate 41 returns along a falling edge 62 from its high value to its low value. The falling edge 59 also results in a falling edge 63 in the R/W REQ I signal at the terminal 22. The time between the falling edge 59 and the falling edge 63 is indeterminate, as is indicated by a dotted arrow 64. The falling edge 63 causes the AND gate 21 to be disabled, and thus causes the output signal of that AND gate and of the OR gate 31, which is the R/W CYC REQ signal, to return along a falling edge 66 from its high value to its low value, as is pointed out by an arrow 67.

Independently, the BUSY I signal applied to the input terminal 12 drops along a falling edge 68 from its high value to its low value, and this event causes the flip-flop 17 to be reset. The causal relationship between these two events is indicated by an arrow 69 pointing toward a falling edge 71 representative of the fact that the Q output terminal of the flip-flop 17 is returning to its low level at the end of the ACK I signal. This is the end of control of the system resource 44 by signals applied to the terminals 12 and 22.

When the BUSY II signal and the R/W REQ II signal are applied to the input terminals 13 and 29, respectively, the circuit shown in FIGS. 1A and 1B undergoes a set of transitions similar to those just described. A rising edge 72 in the BUSY II signal, together with the fact that the ACK I signal is at its low level, establishes the conditions, represented by an arrow 73, necessary to cause the Q output terminal of the flip-flop 26 to shift along a rising edge 74 from its low level to its high level. At a later time, the R/W REQ II signal rises along a rising edge 76 from its low value to its high value, and this condition and the fact that the ACK II signal is already at its high level establish the conditions, represented by an arrow 77, to cause the R/W CYC REQ signal to go from its low level to its high level along a rising edge 78. This produces an effect identical with that produced at occurrence of the rising edge 52, namely, that the rising edge 78, along with the fact that the REF CYC REQ signal is at its low level, result in a condition, indicated by an arrow 79, that causes the flip-flop 36 to be set so that the Q terminal thereof goes from its low value to its high value along a rising edge 81. This, in turn, produces a condition, represented by an arrow 82, to cause the output signal of the OR gate 41 to go from its low value to its high value along a rising edge 83 and establish the beginning of the second reading interval READ II.

As before, the duration of the READ II interval is indeterminate and at some time after the rising edge 83, and as is indicated by a dotted arrow 84, the read/write acknowledge signal RWACK at the output terminal of the flip-flop 36 is caused, by circuit elements not shown in FIGS. 1A and 1B, to return along a falling edge 85 from its high level to its low level. This produces a condition, indicated by an arrow 86, that causes the output signal of the OR gate 41 to return from its high level to its low level along a falling edge 87, thereby terminating the interval READ II.

Subsequently, as indicated by a dotted arrow 88, the R/W REQ II signal returns from its high level to its low level along a falling edge 89, which disables the AND gate 28 and produces a condition, indicated by an arrow 91, that causes the R/W CYC REQ signal at the output terminal of the AND gate 28 and the output terminal of the OR gate 31 to return from its high level to its low level along a falling edge 92. Independently, the BUSY II signal is terminated and returns from its high level to its low level along a falling edge 93, thereby producing a condition represented by an arrow 94 that causes the ACK II signal to return along a falling edge 96 from its high level to its low level as the flip-flop 26 is reset and the Q terminal thereof returns to its low level.

This completes the description of non-contending operation of the circuit in FIGS. 1A and 1B, first by the BUSY I signal and the R/W REQ I signal, and later by the BUSY II signal and the R/W REQ II signal.

Figure 8:
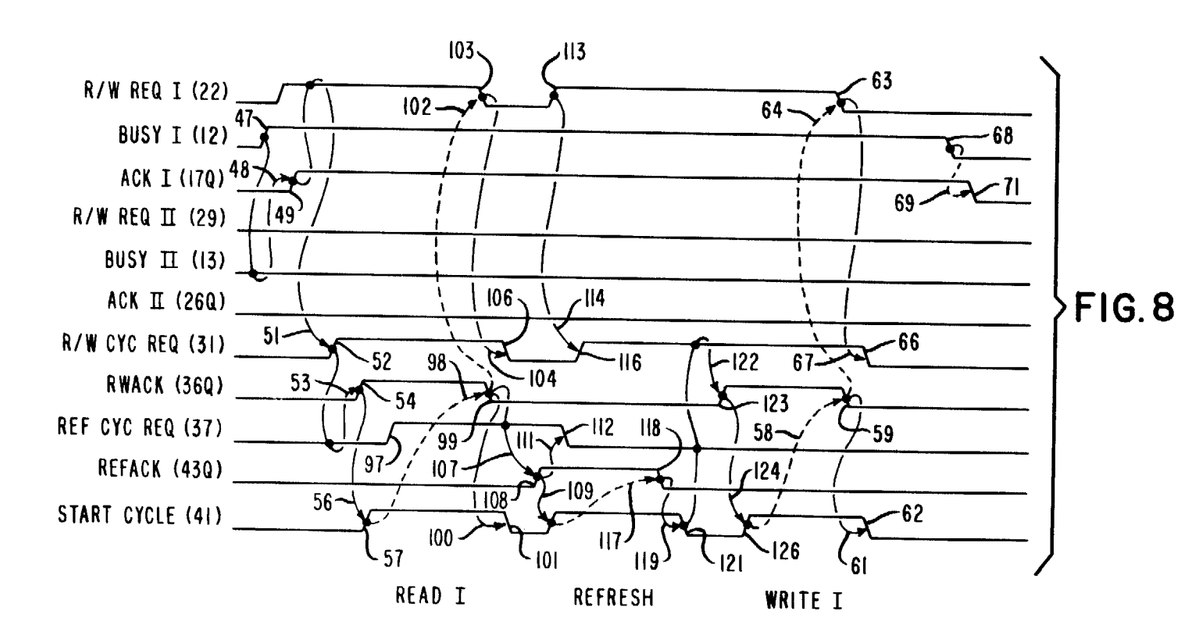
FIG. 8 illustrates signals produced during the operation of the FIGS. 1A and 1B embodiment when a read/write cycle is interrupted by a refresh signal.

FIG. 8 represents the timing conditions when a read-write cycle is interrupted by a refresh signal from the refresh timer 37.

The read-write cycle happens to be one that originates with the BUSY I signal and the R/W REQ I signal, but it could just as well be one that originates with the BUSY II signal and the R/W REQ II signal. The initial part of the cycle is identical with the initial part of the cycle in FIG. 7, and the events and conditions are illustrated by the same reference numerals, up to the reference numeral 57 at the beginning of the READ I interval, and this part of the cycle will not be described again in detail.

The refresh timer 37 produces an output signal REF CYC REQ that goes from its low value to its high value along a rising edge 97 sometime during the READ I interval. However, this does not interrupt the read operation. Instead, the REF CYC REQ signal remains at its high level until the R/W REQ I signal has finished its first active interval and the flip-flop 36 is reset by a read/write clear (low) signal, R/W CLR/. This occurs sometime after the beginning of the READ I interval, as indicated by a dotted arrow 98 that points toward a falling edge 99 of the RWACK signal at the Q output terminal of the flip-flop 36. This supplies a low input voltage on one input circuit of the OR gate 41, as indicated by an arrow 100, and since the other input circuit of the OR gate also has a low voltage, the output voltage of the OR gate 41 drops from its high value to its low value along an edge, indicating the end of the READ I interval and the loss of control of the system resource 44 by the R/W REQ I signal. The read portion of the R/W REQ I signal terminates at a time indicated by a dotted arrow 102 as the signal moves along a falling edge 103. This disables the AND gate 21, as is indicated by an arrow 104, and causes the output terminal of the AND gate to drop along a falling edge 106. This is the R/W CYC REQ signal that is also present at the output terminal of the OR gate 31.

The falling edge 99 of the RWACK signal, together with the high level at the output terminal of the refresh timer 37, as indicated by the REF CYC REQ signal, produces the conditions, indicated by an arrow 107, necessary to set the flip-flop 43 and cause the output terminal thereof to go along a rising edge 108 from its low value to its high value.

While there is a substantial interval indicated between the rising edge 97 at the beginning of the REF CYC REQ signal and the rising edge of the REFACK signal at the Q output terminal of the flip-flop 43, there is a minimum possible length of time between these two events due to the fact that the delay element 39 prevents the flip-flop 43 from being reset instantaneously with the occurrence of the rising edge 97. This prevents the flip-flop 43 from being set during an interval of time when an R/W CYC REQ signal might also be trying to set the flip-flop 36. This delay is very useful in establishing proper operation of the arbiter 34.

The rising edge 108 of the REFACK signal applied to the OR gate 41 produces two effects, as indicated by arrows 109 and 111. It results in having a high signal applied to the OR gate 41, which institutes a new start cycle signal at the output of that OR gate to control the system resource 44. It also terminates the REF CYC REQ signal from the refresh timer 37 and causes the latter signal to return from its high value to its low value along a falling edge 112.

While the REFACK signal is at its high level, and the system resource 44, which is assumed in this embodiment to be a dynamic random access memory, is being refreshed, the R/W REQ I signal may return from its low level to its high level along a rising edge 113 at the beginning of the WRITE interval of that signal. The BUSY I signal and, therefore, the ACK I signal have remained at their high levels since their respective rising edges 47 and 49. The fact that the ACK I signal is at its high level enables the AND gate 21 so that the rising R/W REQ I signal completes the conditions indicated by the arrow 114 to cause the output terminals of the AND gate 21 and the OR gate 31 to rise to their respective high levels at the beginning of the R/W CYC REQ signal, as indicated by the rising edge 116 in that signal.

The R/W CYC REQ signal does not immediately take over control of the arbiter 34 and the system resource 44. Instead, the refresh operation continues for such time as is necessary, as is indicated by a dotted arrow 117, and at the end of that time, the flip-flop 43 is set by a refresh clear signal REF CLR/ of the proper polarity, which causes the REFACK signal to drop along a falling edge 118 from its high level back to its low level. This makes both of the input terminals of the OR gate 41 have a low signal applied to them, which establishes the condition, indicated by an arrow 119, to cause the start cycle signal at the output terminal of the OR gate 41 to drop from its high level to its low level along a falling edge 121, thereby terminating control of the system resource 44 by the refresh circuit. The falling edge of the start cycle signal, together with the fact that the REF CYC REQ signal at the output of the refresh timer 37 has already returned to its low level, and further coupled with the fact that the R/W CYC REQ signal is waiting at its high level, establish the conditions indicated by an arrow 122 necessary to set the flip-flop 36 and cause the RWACK signal at the Q output terminal thereof to go from its low value to its high value along a rising edge 123. This condition, as indicated by an arrow 124, represents the application of a high voltage to the upper input terminal of the OR gate 41 and is sufficient to cause the START CYCLE output signal of that OR gate to shift along a rising edge 126 from its low level to its high level. The system resource 44 is now in its WRITE I interval, which, insofar as the circuit in FIG. 1 is concerned, is identical with the READ II interval in FIG. 7. Other components related to the system resource 44 control the operation of the system resource to allow it to distinguish between a READ II interval and a WRITE I interval, but those components are not part of the present invention. The events that terminate the WRITE I interval are identical with those that terminate the READ I interval in FIG. 7 and are indicated by the same reference numerals. Therefore, it is unnecessary to describe the operation in detail again.

This completes the description of one of the important capabilities of the circuit in FIGS. 1A and 1B, that is, its ability to allow a refresh operation to take place between a read and a write cycle in a read-modify-write operation. Furthermore, this can be done without interfering with either the read operation, the write operation, or the refresh operation. Instead, the refresh operation is inserted after a read operation and before a write operation, while the system resource 44 is not under the control of either of those signals. The write operation cannot start too soon, and thereby interfere with the refresh operation, because the latter maintains control of the system resource for as long as is necessary, and during that interval, the write signal is held in a buffer (not shown).

Figure 9:
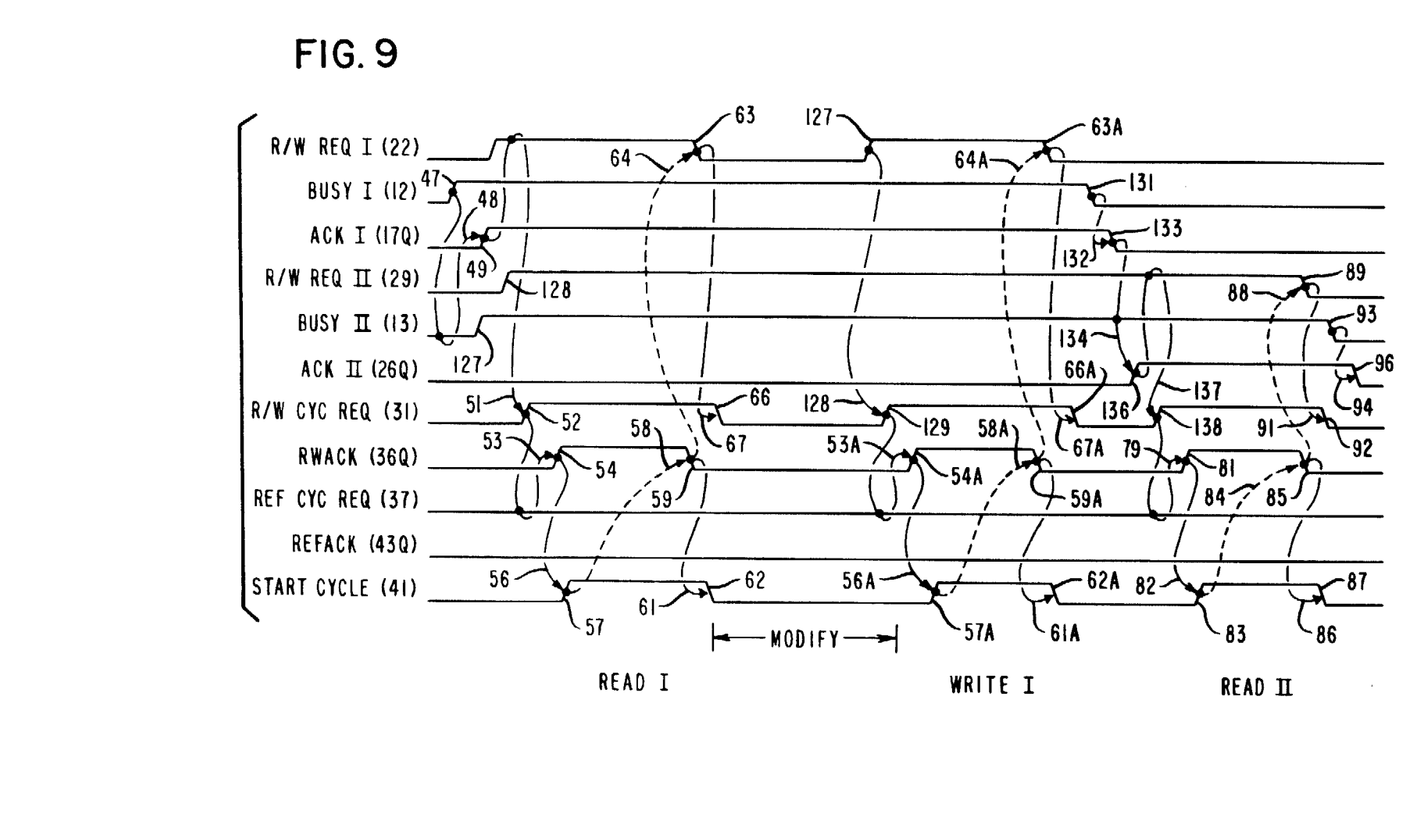
FIG. 9 illustrates signals produced during a read-modify-write cycle which cycle includes an attempt to take over system control.

FIG. 9 illustrates another important operating characteristic of the circuit in FIGS. 1A and 1B, namely the ability of either of the sets of signals applied to the first arbiter 11 to maintain control of that arbiter throughout a complete read-modify-write cycle, even though the other set of signals applied to that arbiter would attempt to take over control, and could do so during the modify portion of the cycle.

The entire first part of the operation shown in FIG. 9 is identical with the first part of the operation shown in FIG. 7 up through the termination of the R/W CYC REQ signal at the falling edge 66. The events during that part of the cycle are illustrated by the same reference numerals, and it is therefore not necessary to describe this part of the operation in detail again.

In FIG. 9, the falling edge 63 of the R/W REQ I signal does not represent the end of the complete read-modify-write cycle but only the end of the read portion thereof. However, this does disable the AND gate 21, which establishes the necessary condition, indicated by the arrow 67, to cause the R/W CYC REQ signal at the output terminal of the OR gate 31 to return from its high level to its low level along the falling edge 66. In the absence of the arbiter of this invention, a contending signal applied to the terminals 13 and 29 would be able to take over control of access to the system resource 44. What prevents that from occurring in the present invention is that the Q/ output signal of the flip-flop 17 is at a low level as long as the ACK I signal is at a high level. The low level Q/ signal from the flip-flop 17 disables the NAND gate 24 and prevents the flip-flop 26 from being set by the BUSY II signal applied to the input terminal 13. As a result, the AND gate 28 is never enabled during this part of the cycle, but the AND gate 21 remains enabled by the ACK I signal so that when the R/W REQ I signal returns to its high level at the time of the rising edge 127, the condition indicated by an arrow 128 is established to return the R/W CYC REQ signal at the output of the AND gate 21 and of the OR gate 31 to return to its high level along a rising edge 129. This places the system in the same condition as it was at the occurrence of the rising edge 52 of the R/W CYC REQ signal. In accordance with the similarity between these parts of the operating cycles, the subsequent events are identified by the same reference numerals as used during the READ I interval, but with the addition of a postscript "A". The only difference is that the event that takes place during the interval between the rising edge 57A and the falling edge 62A is the WRITE I interval, which takes place while information related to some extent to that read during the READ I interval is being written into memory.

At some time following the termination of the R/W CYC REQ signal indicated by the falling edge 66A, which time is not under the control of the circuit in FIGS. 1A and 1B, the BUSY I signal applied to the input terminal 12 returns from its high level to its low level along the falling edge 131, thereby establishing the necessary condition indicated by an arrow 132, to reset the flip flop 17 and return the Q output terminal thereof to the low level, as indicated by a falling edge 133 of the ACK I signal. The BUSY II signal applied to the input terminal 13 has remained at its high level throughout the entire read-modify-write cycle of the R/W REQ I signal, and, with the occurrence of the falling edge 133, the conditions, represented by an arrow 134, are complete for setting the flip-flop 26 and thereby causing the ACK II signal at the Q output terminal of that flip-flop to rise along the rising edge 136 from the low level to the high level thereof. This condition, together with the fact that the R/W REQ II signal has long been at its high level, completes the conditions indicated by the arrow 137 necessary to enable the AND gate 28. As a result, the output signal of this AND gate, and the output signal of the OR gate 31, R/W CYC REQ shifts along a rising edge 138 from the low level to the high level. This places the circuit in FIGS. 1A and 1B in exactly the same condition that it was in at the time of the rising edge 78 of the R/W CYC REQ signal in FIG. 7. The remainder of the operation depicted in FIG. 9 will therefore be identified by the same reference numerals as the part of FIG. 7 describing the READ II interval, and this operation will not be described again in detail.

It is possible for parts of the system that supply the input signals to the terminals 12, 13, 22 and 29 to malfunction so that one of the sets of signals, either the BUSY I signal and the R/W REQ I signal or the BUSY II signal and the R/W REQ II signal could have the levels necessary to maintain control of the system resource 44 for an indefinite period of time. In order to prevent this from happening, the RWACK system from the Q output terminal of the flip-flop 36 of the second arbiter 34 is connected to the safety timer 46 to generate an output signal if the RWACK signal has been stationary without any shifting from a read to a write cycle for a certain period of time, such as about ten microseconds, the safety timer will produce an output signal to be applied to the low active input OR gates 18 and 27 to reset whichever one of the flip-flops 17 or 26 happens to be locked into its set condition by the malfunctioning signal. The safety timer 46 is of a type that starts its timing operation over again at the occurrence of each change of the RWACK signal and only times out if the RWACK signal remains at a constant value too long.

While this invention has been described in terms of a specific embodiment and a specific series of steps, it will be understood by those skilled in the art that modifications may be made therein within the scope of the invention.

We claim:

1. In a system comprising a system resource to which a first signal must be applied within an interval of time of predetermined length and to which at least second and third intermittent signals, which may be in contention with each other and with the first signal for access to the resource, may be applied, an arbiter circuit comprising:

a first arbiter means comprising at least first and second input means for receiving said second and said third intermittent signals, respectively, and also comprising at least first and second output means, for delivering an enabling signal to either said first or said second output means according to which of the intermittent signals establishes control of said first arbiter means during a substantially contemporaneous occurrence of the intermittent signals;

a first and a second input terminal means for receiving fourth and fifth control signals respectively;

a first control menas connected to the first output means of said first arbiter means to be controlled by said enabling signals from the first output means, the first control means being connected to said first input terminal means for receiving the fourth control signal, for outputting the fourth control signal when the first control means is enabled;

a second control means connected to the second output means of said first arbiter means to be controlled by said enabling signals from the second output means, the second control means being connected to said second input terminal for receiving the fifth control signal, for outputting the fifth control signal when the second control means is enabled;

a second arbiter means comprising first input means connected to the first and second control means to receive the signal outputted therefrom, and further comprising second input means, connected to receive the first signal and first and second output means for arbitrating in favor of said first signal when contention occurs between said first signal and the signal provided either by said first or said second control means; and a resource access control means connected to the first and the second output means of the second arbiter means to be controlled selectively by output signals therefrom.

2. The invention as defined in claim 1 in which said first arbiter means is comprised of:

a non-metastable latch circuit connected to said first input means for receiving the second intermittent signal;

a flip-flop circuit having first and second input circuits;

a gate circuit connected to the latch circuit to receive signals therefrom and having an output circuit connected to the first input circuit of the flip-flop circuit; and a delay means connected serially between the second input means and the second input circuit of the gate circuit, whereby the gate circuit is enabled to transit actuating signals to the first input terminal of the flip-flop circuit only when the latch circuit is in an inoperative condition and the third intermittent signal has been active for a period of time longer than the delay period of said delay means.

3. The invention as claimed in claim 2, comprising, in addition:

a safety timer means having an output circuit; and a gating means for connecting the output circuit of said safety timer to said latch circuit and to said flip-flop for resetting said latch circuit and said flip-flop if either of them has been set for a period of time determined by said safety timer.

4. The invention as defined in claim 3 wherein said gating means is comprised of a first OR gate having a first input circuit connected to said first input means and an output circuit connected to a resetting terminal of said latch circuit, and a second input circuit connected to the output circuit of said safety timer, whereby the OR gate transmits either the second intermittent signal or the output signal of said safety timer to reset said latch circuit.

5. The invention as defined in claim 3, wherein said gating means is comprised of:

a second OR gate comprising a first input circuit connected to the second input means to receive the third intermittent signal, a second input circuit connected to the output circuit of said safety timer to receive timed signals therefrom, and an output terminal connected to the second output terminal of said flip-flop to reset said flip-flop in response either to the third intermittent signal or the output signal of said safety timer.

6. The invention as defined in claim 1, in which said first control means comprises an AND gate having first and second input circuits, the fourth signal being connected to the first input circuit of said AND gate, and the first output means of said first arbiter being connected to the second input circuit of said AND gate.

7. The invention as defined in claim 1 in which said second control means comprises an AND gate having first and second input circuits, the fifth signal being connected to the first input circuit of said AND gate, and the second output means of said first arbiter means being connected to the second input circuit of said AND gate.

8. The invention as claimed in claim 1 comrpising a system resource connected to said resource access control means to be controlled thereby.

9. The invention as claimed in claim 8 in which the system resource is a dynamic random access memory.

10. The invention as claimed in claim 9 and further comprising:

a refresh timer, the output signal of said timer comprising said first signal to be applied within each interval of time of predetermined length to said second arbiter means for controlling the refresh of said dynamic random access memory.

11. A method of operating a system having a system resource that can be controlled by only one signal at a time out of a plurality of at least three signals that may be applied substantially simultaneously to control the system resource, at least a second and a third of such signals being capable of controlling the system resource indefinitely to the exclusion of the remaining signals, the system having a mandatory requirement that the first signal have control of the system resource at predetermined periodic intervals to the exclusion of any of the other signals, said method comprising the steps of:

arbitrating between the second, third and any other signals, excluding the first signal, to determine, as between them, the successful one to enable passage of a signal related to the successful one;

presenting the enabled signal for such arbitration as a series of transactions with interruption times between each of the transactions and its successor transaction; and arbitrating between the presented signal and the first signal to determine, as between them, at the end of each of the transactions, the controlling signal to control the signal resource with said first signal having priority.

12. The method of claim 11 comprising the further step of interrupting the arbitration between the second, third and any other signals, excluding the first signal, if the presented signal continues without interruption as a single transaction for more than a certain length of time.

* * * * *